US009379232B2

(12) United States Patent
Kelber et al.

(10) Patent No.: US 9,379,232 B2
(45) Date of Patent: Jun. 28, 2016

(54) MAGNETO-ELECTRIC VOLTAGE CONTROLLED SPIN TRANSISTORS

(71) Applicants: University of North Texas, Denton, TX (US); Quantum Devices, LLC, Potomac, MD (US)

(72) Inventors: Jeffry A. Kelber, Plano, TX (US); Christian Binek, Lincoln, NE (US); Peter Arnold Bowden, Crete, NE (US); Kirill Belashchenko, Lincoln, NE (US)

(73) Assignee: QUANTUM DEVICES, LLC, Rockville, MD (US)

( * ) Notice: Subject to any disclaimer, the term of this patent is extended or adjusted under 35 U.S.C. 154(b) by 66 days.

(21) Appl. No.: 14/182,521

(22) Filed: Feb. 18, 2014

(65) Prior Publication Data

US 2014/0231888 A1    Aug. 21, 2014

Related U.S. Application Data

(60) Provisional application No. 61/766,025, filed on Feb. 18, 2013.

(51) Int. Cl.
| | |
|---|---|
| *H01L 21/02* | (2006.01) |
| *H01L 29/78* | (2006.01) |
| *H01L 29/66* | (2006.01) |
| *H01L 29/51* | (2006.01) |
| *G11C 11/56* | (2006.01) |
| *H01F 10/00* | (2006.01) |
| *G11C 11/16* | (2006.01) |
| *B82Y 10/00* | (2011.01) |
| *H01L 29/16* | (2006.01) |
| *H01F 10/32* | (2006.01) |

(52) U.S. Cl.
CPC .............. *H01L 29/78* (2013.01); *G11C 11/161* (2013.01); *G11C 11/5607* (2013.01); *H01F 10/002* (2013.01); *H01L 29/517* (2013.01); *H01L 29/66984* (2013.01); *B82Y 10/00* (2013.01); *H01F 10/3268* (2013.01); *H01L 29/1606* (2013.01)

(58) Field of Classification Search
USPC .................................. 257/4, 24, 194, 213, 295
See application file for complete search history.

(56) References Cited

U.S. PATENT DOCUMENTS

2008/0169492 A1* 7/2008 Koo et al. ....................... 257/295
2012/0091423 A1* 4/2012 Sumino ............................ 257/4

OTHER PUBLICATIONS

A.F. Andreev. JETP Lett. 63, 758 (1996).
K.D. Belashchenko, Phys. Rev. Lett. 105, 147204 (2010).
M. Bibes, A. Barthélémy, Nature Materials 2008 7, 425-426.
Ch. Binek, B. Doudin, J. Phys. Condens. Matter 17, L39-L44 (2005).
P. Borisov, A. Hochstrat, X. Chen, W. Kleemann, Ch. Binek, Phys. Rev. Lett. 94, 117203 (2005).

(Continued)

*Primary Examiner* — Errol Fernandes
(74) *Attorney, Agent, or Firm* — Steven B. Kelber (57) ABSTRACT

The invention relates to a magneto-electric spin-FET including a gate film of chromia and a thin film of a conductive channel material which may be graphene, InP, GaAs, GaSb, PbS, $MoS_2$, $WS_2$, $MoSe_2$, $WSe_2$ and mixtures thereof. The chromia, or other magneto-electric, and conduction channel material are in intimate contact along an interface there between. The resulting magneto-electric device may be voltage-controlled and provide non-volatile memory.

8 Claims, 6 Drawing Sheets

(56) References Cited

OTHER PUBLICATIONS

J. de Brosse, Nanotechnology Symposium, Cornell's CNS, slides available online at: http://www.cns.cornell.edu/documents/JohnDeBrosseCNSSymp504.pdf, May 14, 2004.
Y.-H. Chu, et al., Nat. Mater. 7, 478-482 (2008).
S. Datta and B. Das, Applied Physics Lett. 56, 665 (1990).
H. Dery, P. Dalai, L. Cywiński, L.J. Sham, Nature 447, 573 (2007).
P.A. Dowben, D. LaGraffe, D. Li, A. Miller, Ling Zhang, L. Dottl, and M. Onellion, Physical Review B 43 (1991) 3171-3179.
P.A. Dowben, N. Wu, and Ch. Binek, Journ. Phys. Cond. Matter 23 (2011) 171001.
M. Durlam, D. Addie, J. Akerman, B. Butcher, P. Brown, J. Chan, M. DeHerrera, B.N. Engel, B. Feil, G. Grynkewich, J. Janesky, M. Johnson, K. Kyler, J. Molla, J. Martin, K. Nagel, J. Ren, N.D. Rizzo, T. Rodriguez, L. Savtchenko, J. Slater, J.M. Slaughter, K. Smith, J.J. Sun, M. Lien, K. Papworth, P. Shah, W. Qin, R. Williams, L Wise, and S. Tehrani, IEDM Technical Digest, p. 34.6.1 (IEEE Press, New York, 2003).
L. Fallarino, A. Berger, and Ch. Binek, Appl. Phys. Lett. 2014 104 022403.
M. Fiebig, "Revival of the Magnetoelectric effect", J. Phys. D: Appl. Phys. 38 (2005) R123-R152.
X. He, Y. Wang, N. Wu, A. N. Caruso, E. Vescovo, K. D. Belashchenko, P. A. Dowben, Ch. Binek, Nature Materials 9, 579 (2010).
M. Johnson, B. R. Bennett, P. R. Hammar, and M. M. Miller, Sol. St. Electron. 44, 1099 (2000).
B.T. Jonker, G. Kioseoglou, A.T. Hanbicki, C.H. Li, and P.E. Thompson, Nature Phys. 3, 542 (2007).
W. Kleemann, J. Appl. Phys. 2013 114 027013.
A. Miller and P.A. Dowben, J. Phys. Condensed Matter 5 (1993) 5459-5470.
A. Ney, C. Pampuch, R. Koch, K.H. Ploog, Nature 425, 485-487 (2003).
Y. G. Semenov, K. W. Kim, J. M. Zavada, Appl. Phys. Lett. 91 (2007) 153105.
Y. G. Semenov, J. M. Zavada, and K. W. Kim, J. Appl. Phys. 107 (2010) 064507.
G. Schmidt et al. Phys. Rev. B 62, R46267 (2000).
S. van Dijken et al. Appl. Phys. Lett. 80, 3364 (2002).
J. O. M. J. van 't Erve, A. T. Hanbicki, M. Holub, C. H. Li, C. Awo-Affouda, P. E. Thompson, B. T. Jonker, Appl. Phys. Lett. 91, 212109 (2007).
J. Wang, J. A. Colón Santana, N. Wu, C. Karunakaran, J. Wang, P. A. Dowben, and Ch. Binek, J. Physics Condensed Matter 26 (2014) 055012.
N. Wu, Xi He, A. Wysocki, U. Lanke, T. Komesu, K.D. Belashchenko, Ch. Binek, P.A. Dowben, Physical Review Letters 106, 087202 (2011).
I. Zaliznyak, A. Tsvelik, D. Kharzeev, U.S. Patent Application US 2010/0109712 A1, May 6, 2010.
T. Zhao, et al., Nat. Mater. 5, 823-829 (2006).
V.V. Zhirnov, J.A. Hutchby, G.I. Bourianoffls, J. E. Brewer, IEEE—Circuits and Devices 21, 37 (2005).

\* cited by examiner

MAGNETO-ELECTRIC VOLTAGE CONTROLLED SPIN TRANSISTORS

This patent application is related to pending U.S. patent application Ser. No. 13/343,970 filed Jan. 5, 2012, entitled COHERENT SPIN FIELD EFFECT TRANSISTOR. This application is also related to U.S. Patent Application 61/936,399 entitled Voltage Switchable Non-Local Spin-FET and Methods of Making Same. The disclosures of both these application are incorporated-by-reference herein.

This application claims benefit of the filing date of Provisional Patent Application 61/766,025 filed Feb. 18, 2013. The entire disclosure of the benefit application is incorporated herein-by-reference.

Aspects of the inventions disclosed and claimed herein were made in the course of work supported by funding grant NSF/MRSEC DMR-0820521. The United States Government may have certain rights in and to those inventions. The inventions disclosed and claimed herein were also made with the support of SRC Funding, including SRC-NRI Task I.D. 2101.01, GRC Nanomanufacturing Task I.D. 2123.01, SRC-NRI Task I.D. 2398.001 and C-Spin theme 2381.01. The support of the SRC is gratefully acknowledged.

BACKGROUND OF THE INVENTION

Background of the Prior Art

Manipulation of magnetically ordered states by electrical means is among the most promising of the approaches towards developing novel spintronic devices. Incorporating this functionality into a device is a Holy Grail of "spintronics". The reasons are simple enough: voltage control of the magnetic state enables nonvolatile device elements whose state may be switched without large current densities and power consumption. Large current densities are, for example, required by spin-torque transfer memory element magnetic devices currently under development. The control of the magnetic state enables non-volatile RAM "on the chip" and such nonvolatile elements, if realized, would eliminate latency time and significantly enhance computing power without a major increase in power consumption: indeed a decrease in power consumption is anticipated [Binek 05, Zhirnov 05, Ney 03, Dery 07]. Current random access memory (RAM) elements require refresh power, and the information is lost when power is lost, which is often not desirable. Overall, a solid state device with a magnetically ordered state is then a memory element that is not volatile or easily "lost".

Most efforts at providing magnetic memory element solid state devices have used magnetic spin valves or magnetic tunnel junction type structures. With electric (voltage) control of the memory elements, more complex schemes that require a magnetic fringe field to "write" a memory element (as in a magnetic tunnel junction) or a high-current-density pulse (as in a spin-torque transfer element) are not required. A novel approach to voltage controlled magnetic devices envisions the use of a magneto-electric substrate; materials where an applied voltage induces a magnetic moment and where the interface polarization is large [Andreev 96, Belshchenko 10, Dowben 11, He 10, Wu 11]. Here we disclose the structure and the potential of such devices.

Background of Magneto-Electronics

To be implemented in a pragmatic device, controlled by a magneto-electric means, the magneto-electric coercive voltage must be small, the switching speed high, the energy cost and dissipation low. The barriers to magneto-electric switching are thought to scale roughly with volume, so thinner films facilitate this voltage controlled switching of the interface polarization. Of course this also requires that the magneto-electric properties are retained in the thin film limit at elevated temperatures, but if this is indeed the case then the material requires a smaller critical voltage, and exhibits higher switching speeds as well [Fallarino 14].

Unfortunately there is a limit to preserving useful magneto-electric properties, as in the thin film limit the boundary magnetization dominates. We have shown that for ultra-thin chromia films close to the Neel temperature, a magnetic field alone can switch the entire antiferromagnetic spin structure through Zeemann coupling with the boundary magnetization [Fallarino 14]. Reliable isothermal switching of magnetization, by application of a voltage needs to be demonstrated and must be reliable at room temperature and above.

Magneto-electric materials, where a net magnetic moment is induced by an electric field, are a key to this approach of voltage controlled magnetic devices. The basic idea to the magneto-electric device is simple. An applied electric field $\underline{E}$ results in the induction of net magnetization M [Fiebig 05]. Normally, this linear magneto-electric effect, $M_i = \alpha_{ij} E_j$, is governed by an induction constant ($\alpha_{ij}$) that is very, very small (on the scale of ps/m, 4.13 ps/m in the case of the inorganic magneto-electric $Cr_2O_3$). But the key aspect of the magneto-electric is the boundary magnetization, i.e. the high surface polarization, that accompanies the magneto-electric in the single domain state [Andreev 96, Belshchenko 10, He 10].

The existence of net magnetization at the surface or boundary of magnetoelectric antiferromagnets has been predicted using symmetry arguments [Andreev 96, Belshchenko 10]. We have demonstrated that interface magnetization direction [Dowben 11, Wu 11] and control of the domain size can be achieved with voltage in $Cr_2O_3$ [He 10], and $Fe_2TeO_6$ [Wang 14] (another magneto-electric). It is this interface polarization that is key to the control of the spin state and switching of a free magnetic layer in a magneto-electric controlled device, as the bulk magneto-electric moment is otherwise quite small for all "reasonable" applied voltages. Isothermal switching between the single domain states is achieved when an electric field, $\underline{E}$, and a small symmetry breaking magnetic field, $\underline{H}$, are simultaneously applied such that the magnitude of the product $\underline{E}\,\underline{H}$ overcomes a critical threshold. Note that the symmetry breaking H-field can be scaled down to arbitrary small values when the applied E-field is scaled up accordingly. We have demonstrated that the Earth's magnetic field is sufficient to achieve voltage-control of boundary magnetization in a chromia thin film.

Early attempts in electrically controlled exchange bias tried to exploit the linear magneto-electric susceptibility of the antiferromagnetic material $Cr_2O_3$ as an active exchange bias pinning system [Borisov 05], but controlling the interface magnetization is much more effective. In a magnetoelectric material, an applied electric field induces a net magnetic moment at the interface, which can be used to electrically manipulate the magnetic states of an adjacent exchange coupled ferromagnetic film. The small value of the magneto-electric susceptibility of $Cr_2O_3$ led many researchers to the conclusion that multiferroic materials are better suited for this purpose. Such multiferroic materials have two or more ferroic order parameters, such as ferroelectric polarization and (anti) ferromagnetic order. Coupling between these order parameters has been demonstrated [Chu 08, Zhao 06], however, it is also still typically weak, and the theoretical upper limit of the magnetoelectric susceptibility is rarely reached. Due to the surface and interface magnetization in the single phase $Cr_2O_3$ material, or other magneto-electric ($LuFeO_3$ for example), we overcome the limitation of the small magneto-electric coefficient that plagues the development of voltage controlled magnetic devices using other materials, including multiferroic materials. We disclose here non-volatile electric (voltage) control of boundary magnetization and its application in a spin-transistor and a ultra low power mram device [He 10, Wu 11]. This effect reflects the switching of the bulk antiferromagnetic domain state and the interface magnetization coupled to it. The switchable exchange bias sets in exactly at the bulk Neel temperature [He 10, Wu 11]. In fact, using a ferromagnetic Pd/Co multilayer deposited on the (0001) surface of a $Cr_2O_3$ single crystal, we achieved reversible, room temperature isothermal switching of the exchange bias field between positive and negative values by reversing the electric field while maintaining a permanent magnetic field [He 10].

SUMMARY OF THE INVENTION

Figure 1:
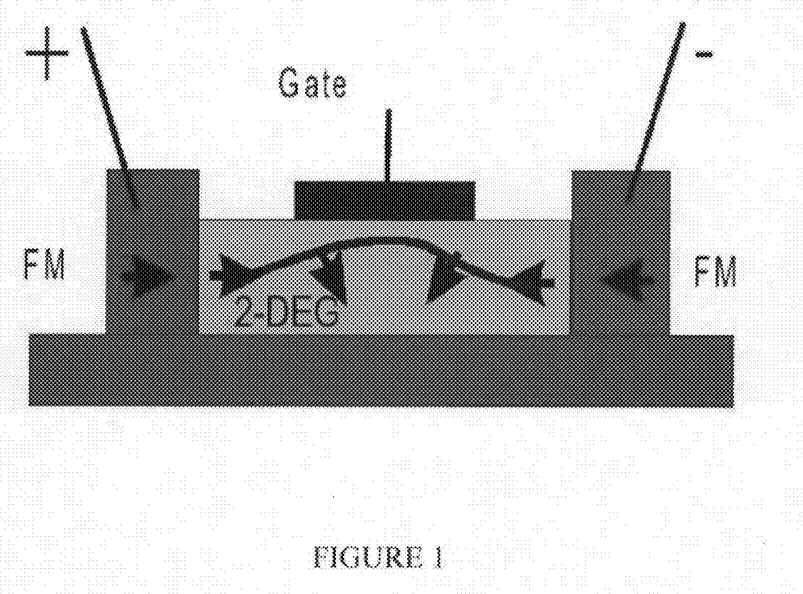
FIG. 1 is a schematic illustration of a spin-FET which may be adapted to the spintronic device of this patent application.

To best understand the subject invention, start with the basic concept of a spin-field effect transistor (a spin-FET), as illustrated in FIG. 1. We modify that structure into a magneto-electric spin-FET. The approach of having spin precession occur down a narrow channel conductor would normally require an external field. And source and drain have to be "magnetized" through spin-torque transfer or external fields. Since the gate dielectric has generally no interface polarization, the above, more complex scheme, also requires a magnetic fringe field to "drive" the spin precession of the logic element. To do this on the transistor level, one transistor at a time, without a magneto-electric, requires a complex architecture so that a local magnetic field can be applied in some fashion, e.g. [Durlam 03, van Dijken 02, Schmidt 00]. Addition wiring to create fringe fields is needed, and the spatial densities of an array of such more conventional spin-FET is extremely limited because the extrinsic magnetic fields will be difficult to restrict, without the stray fields influencing adjacent transistors in any dense array.

The magneto-electric spin-FET concept outlined here is to use $Cr_2O_3$, or any other suitable magneto-electric (e.g. $LuFeO_3$, etc.), as a gate dielectric for a spin-FET and exploit the voltage controlled interface magnetization to polarize the narrow channel conductor. The device concept benefits from the key fact that magneto-electrics are in fact great dielectrics and make great dielectric gate barriers. The success of the whole idea behind the magneto-electric spin-FET is based on the ability of the magneto-electric interface to polarize the narrow (in this case very thin) narrow channel conductor/ semiconductor channel of the FET intimate contact, while at the same time acting as the gate dielectric. Furthermore, this interface polarization of the magneto-electric gate is voltage controlled (a consequence of the magneto-electric properties), and under many conditions also not volatile (i.e. requiring no refresh current). As this interface polarization may be voltage controlled, a nonvolatile transistor that combines both memory and logic at low power can be provided. Dimensions of the device will vary substantially with the materials selected. In general, the conduction channel should have a width of no more than 1-2 nm, with thinner generally being better. Conduction channels may be as thin as 2-5 monolayers (ML) in special cases. At the other extreme, if, e.g., properly doped GaAs is selected, a thicker channel, on the order of up to 100 nm may be used. Similarly, the thickness of the chromia gate, either bottom or top, will be situation dependent. There is a limit to the thinness of the chromia or other material employed, and it probably needs to be thicker than about 3-5 nm. Thicknesses on up to 200 angstroms may be effective.

Quantum mechanical exchange coupling between the boundary magnetization and the spins of the carriers in the narrow channel of the FET gives rise to damped precession of the spins injected from the source of the FET into the channel. When utilizing channel materials with virtually zero spin-orbit coupling, such as graphene or Si, the effective exchange field of the voltage-controlled boundary magnetization is the sole source for spin precession. If the narrow channel conductor is sufficiently thin, the transport channel will be spin polarized by the proximity effect, providing coherent spin transport or modulated spin precession. For a given remanent boundary magnetization, the exchange field will determine the spin state of the carriers at the analyzer (FM drain) in concert with the length of the channel. Electrical spin injection and controlled spin precessional motion in silicon lateral transport devices using externally applied magnetic fields at room temperature and above has been demonstrated [van't Erve 07, Jonker 07]. Spin field effect transistors [Dery 07, Semenov 07, Semenov 10, Zaliznyak 10], have certainly been described using graphene and other narrow channel conductors.

BRIEF DESCRIPTION OF THE DRAWINGS

The drawings constitute part of the disclosure of this patent application and are intended to assist in more fully disclosing the invention.

DETAILED DESCRIPTION OF THE INVENTION

The device described below works because of the huge interface polarization of dielectric chromia (described below as the gate dielectric). This boundary polarization is voltage controlled and described above [He 10, Belashchenko 10, Wang 14]. The narrow channel (i.e. thin) conductor (graphene, InP, GaSb, PbS, $MoS_2$, $WS_2$, $MoSe_2$, $WSe_2$, etc.) of the FET schemes described below are polarized by this very high interface polarization, a proximity effect. The proximity effect was originally described as a mean field effect in magnetism, not directly attributed to any specific material and is embodied by the Landau-Ginzburg equation, for which solutions are known for some boundary conditions [Dowben 91, Miller 93]. We need to divide the concept into actually two types of devices nonetheless.

(A) The Large Field, Very Short Channel Regime:

Conduction bands are strongly exchange-split. Spin precession length is microscopic, and spins completely decohere over small lengths, or do not precess. Here we have a magnetized semiconductor sandwiched between leads in the lateral geometry. In this regime it is sufficient to have one magnetic lead to measure magneto-resistance while the source contact can be a nonmagnetic metal. We estimate a high on/off ratio with magneto-resistance larger than 200% at room temperature, with little effort at improving the source and drain polarizations. In this regime, the magnetization of the electrode and of the magneto-electric's boundary magnetization should not be orthogonal.

Figure 2:
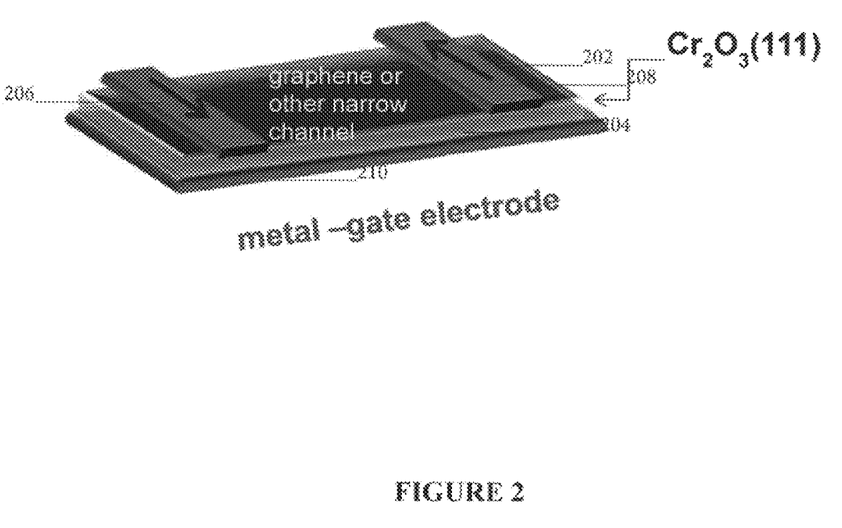
FIG. 2 is an illustration of a first embodiment of the electronically controlled spin-FET of this invention.

Here, as shown in FIG. 2, the dark "blue" is the narrow channel conductor 202, with the dielectric chromia grey below 204, with an electron/hole channel 206/208 on top of the chromia. Gate electrode 210 is provided "underneath" the chromia in this embodiment. As the narrow channel conductor in in proximity to a magneto-electric oxide in this embodiment, it must be recognized that the narrow channel conductor may well be extrinsically doped p-type by the gate, if too thin, but both n- and p-type channel conductors are known. We have recently demonstrated we can grow the structure above. The narrow (thin) channel conductor/semiconductor (light blue) could be anything really, suitable to the task (graphene, InP, GaAs, GaSb, PbS, $MoS_2$, $WS_2$, $MoSe_2$, $WSe_2$, etc.).

The switching of only the source or drain electrode magnetization may be necessary and might be achieved at the "set-up" of the transistor, after fabrication or later by spin-torque transfer of other voltage controlled switching, as in a voltage controlled magnetic tunnel junction or spin valve. Those of skill in the art will recognize that in many cases, the conductive elements, particularly the alloyed materials, can be enhanced by appropriate doping. Suitable dopants include Mn, Cr, Co, V, Sc, Y, Gd, Nd, Tb, Ho, Dy, Sm, La and Yb. Selecting GaAs for example, these would all substitute into the gallium sites, while S, Se and Te might occupy the arsenide sites or vacancies.

(B) Low-Field Regime:

The Datta-Das transistor is a concept that has captured imagination for decades [Datta 90]. Spin precession is envisioned as the spins travel from the ferromagnetic (FM) source to a FM drain contact, which serves as a spin analyzer. The applied gate voltage controls the spin precession through the electric field through the spin-orbit dependent Rashba effect and thus controls the source-drain current. A major obstacle for the realization of an effective room temperature Datta-Das spin-FET is the weakness of the Rashba effect. One approach to overcome this obstacle is the magneto-electric spin-FET. This fundamentally overcomes the problem of weak Rashba spin-orbit coupling by either fully replacing or significantly supporting the Rashba effect through a magnetic field derived from a voltage-controlled magneto-electric material. If the spin-splitting is tuned in such a way that the precession length is of the order of the channel length, we can have magneto-resistance controlled by the Hanle effect.

Figure 3:
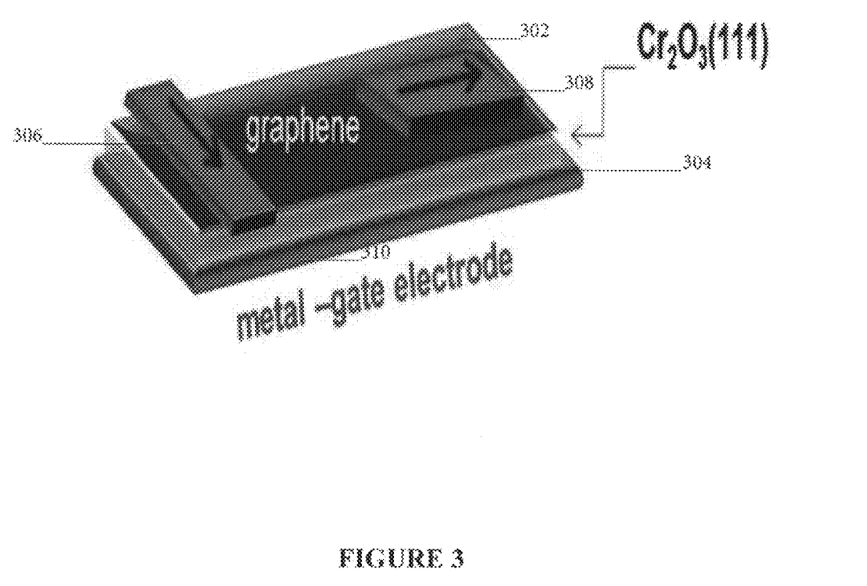
FIG. 3 is an illustration of a second embodiment of the electronically controlled spin-FET of this invention.

Here we need two magnetic electrodes 306, 308 magnetized orthogonal to the boundary magnetization of the magneto-electric gate 310 (FIG. 3). In order to realize voltage-controlled resistance change, the angle between the electrodes should be appropriately selected (and it cannot be 180 degrees). In this low-field scenario it is important that spin coherence is maintained over the entire length of the channel 302. The magneto-electric spin-FET proposed fundamentally overcomes the problem of weak Rashba spin-orbit coupling by either fully replacing or significantly supporting the Rashba effect through a magnetic field derived from a voltage-controlled magneto-electric material. The electrically switchable and nonvolatile boundary magnetization of magneto-electric antiferromagnets, such as chromia 304, generates a voltage-controlled exchange field, which determines the spin precession of the carriers in the conducting channel 302. It is important to realize this occurs through a sort of proximity effect, and that the chromia or other magneto-electric is a dielectric thus is the gate dielectric in this scheme. The device scheme at its most simple is illustrated in FIG. 3. Here, the switching of the only the source or drain electrode magnetization is not necessary and might be at the "set-up" stage of the transistor, after fabrication, but before "use".

Graphene is a gapless semiconductor, so that silicon or InP, GaAs, GaSb, PbS, $MoS_2$, $WS_2$, $MoSe_2$, $WSe_2$, etc. may be more desirable. The choice of semiconductor for the narrow channel depends on whether the magneto-electric FET is of type A (no or little spin orbit coupling) or type B, where spin orbit coupling might be desirable.

Magneto-resistance ratios of factors of 2-3 are certainly possible at room temperature, but it is very likely that 20-30 time magneto-resistance ratios at room temperature are possible. Achieving the high magneto-resistance ratios requires higher fidelity spin polarized current injection and spin precession, as well as wave vector filtering mechanisms, but these are "known" effects for increasing MR ratios. The above device concepts also have a major advantage in that memory and logic operations are combined: the device state is nonvolatile, but "switchable". Multistate logic may be possible. Multilogic states could be envisioned through a transistor architecture like that shown in FIG. 4, although as noted above, the narrow channel conductor need not be graphene.

Figure 4:
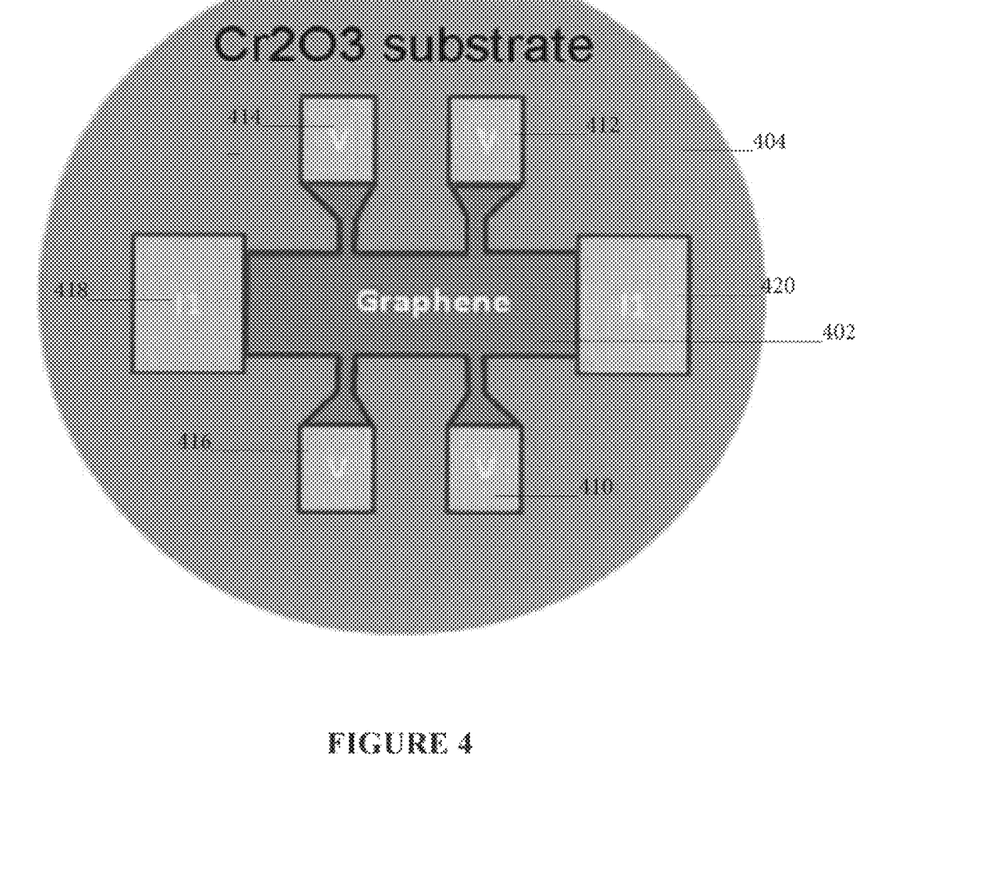
FIG. 4 is a schematic illustrating a multistate logic device of the invention.

Such a device is shown in schematic form as a multistate 7 terminal (410, 412, 414, 416, 418, 420) FET in FIG. 4. The chromia 404 (green) is the gate dielectric and polarizes the graphene or other narrow channel conductor 402 (InP, GaAs, GaSb, PbS, $MoS_2$, $WS_2$, $MoSe_2$, $WSe_2$, etc.) by proximity. The gate electrode is not shown in this schematic but takes the same form and composition as in the devices of FIGS. 2 and 3 above, and FIG. 5 below.

Figure 5:
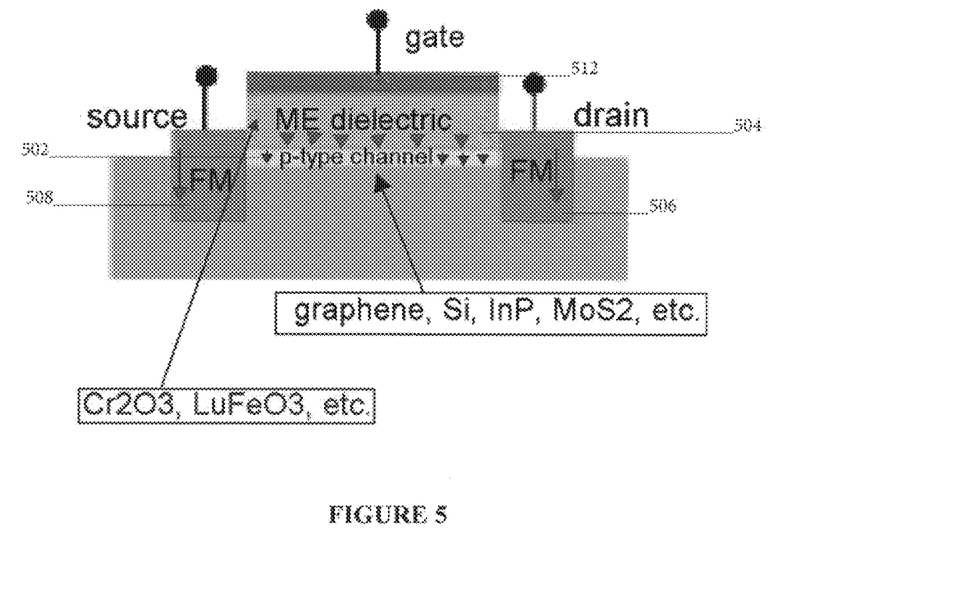
FIG. 5 is a schematic of an electro-magnetic spin-FET of the invention in a top gate embodiment.

It should be understood that in all likelihood, the magneto-electric needs to be grown on top of the narrow channel conductor with either the source or drain a source of spin polarized current (to either inject or sense), much like the schematic reflected in FIG. 5. This is a "top gate" 512 embodiment with the chromia 504 overlying conduction channel 502. Source and drain 506 and 508 are provided as above. Those of skill in this art will recognize that "top" and "bottom" as well as "above" and "below" are abstract terms as applied to the completed device, and used for reference in the interests of clarity. No external magnetic field is required, and no refresh current is needed (low power). Multi-logic state memory or computing may be possible.

Device Implementation

As stated at the outset, the implementation of any magneto-electric device means low power, but also low loss. If the current or voltage gains are too small, the logic fidelity will be suspect and the utility much diminished. But the electrodes can also be controlled by voltage using a different scheme and thus increasing the MR ratios. The magneto-electrics are a possible route for voltage control of magnetization in a magnetic tunnel junction structure [Binek 05, Bibes 08, Kleeman 13], based on the familiar magnetic tunnel junction memory element, which consists of two ferromagnetic (FM) layers separated by a non-magnetic insulator where the device resistance is determined by the relative orientation of the magnetization of the two FM layers. Typically, the magnetization of one FM layer, in a magnetic tunnel junction memory element, is pinned while the second is free to switch between two states. The switching is typically accomplished by fringe fields, or by spin-torque transfer that require large current densities.

Figure 6:
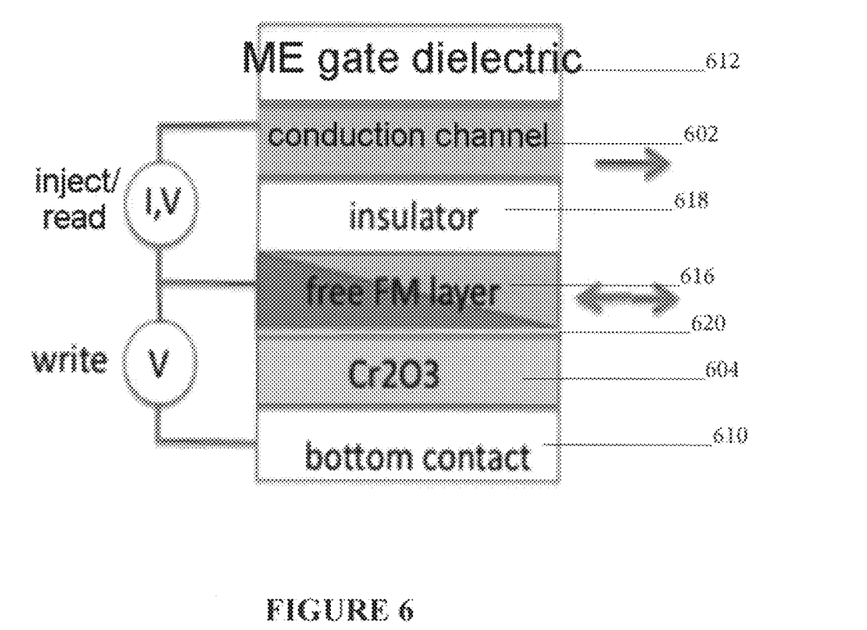
FIG. 6 is a schematic of a voltage-controlled magnetic tunnel junction where free magnetic layer magnetization is controlled by a magneto-electric interface, separating the read and write aspects of the device.

Magneto-electric antiferromagnets, with their voltage-controllable boundary magnetization [Andreev 96, Belshchenko 10, He 10], provide the longed for materials alternative that could enable the development of electrically writable nonvolatile MTJ memory with high speed and high density. In such a device, a simple bias voltage rather than a large current pulse is used to "write" information to the element [Binek 05, Dery 07]. The magnetization of the free layer 616 is exchange coupled to the $Cr_2O_3$ 604 (or other magneto-electric) interface magnetization (FIG. 6) across a non-magnetic layer 620. A bias voltage applied across the $Cr_2O_3$ layer reverses the interface magnetization, which in turn switches the magnetization of the free layer 616 [He 10, Wu 11]. The state of the element is read by detecting the resistance of the FM/insulator/FM stack and the read and write circuits are decoupled. This provides magnetic memory elements controlled entirely by an applied voltage. The resulting device or "stack" includes the gate electrode 612, and the conduction channel 602 separated by an insulator from free layer 616. Chromia 604 and the bottom contact 610 completes the device. The stack can be placed together with a MOS transistor to create a MRAM cell, but the circuit implications will be much different than the normal MRAM, which requires currents for switching the magnetic tunneling stack.

For the standard, magnetic field switched MRAM cell, refer to the situation where the magnetic field is generated by the "write" lines [Durlam 03] which basically are used to generate a magnetic field in close proximity. Currents through two different write lines are required to be coherent in order to produce the net magnetic field needed to switch the free layer of the magnetic tunnel junction stack. A simpler stack is required to use current spin-torque switching of the tunnel stack [Brosse 04]. This circuit is essentially no more complicated than a standard DRAM cell. Yet the magnetoelectric MTJ requires, in principle, no high currents and no external fields. As outlined above, voltage-controlled switching of boundary magnetism in magneto-electric oxides [He 10] has the potential to enable new classes of non-volatile/reprogrammable magneto-electronic devices. By fabricating a nanoscale magnetic gate on top of a sub-micron semiconductor Hall junction, it is shown how fringing magnetic fields emanating into the junction could provide the basis for a bi-stable [Johnson 00] nonvolatile output with the capacity to be reprogrammed within a single clock cycle.

Thus, this invention embraces not only the transistor and transistor-like devices comprised of a ferromagnetic base or gate like chromia and an overlaying conductive channel, but complex devices and computers based thereon incorporating multiple transistors. Non-volatile memory is today typically used for the task of secondary storage, or long-term persistent storage. The most widely used form of primary storage today is a volatile form of random access memory (RAM), meaning that when the computer is shut down, anything contained in RAM is lost. Unfortunately, most forms of currently available non-volatile memory have limitations that make them unsuitable for use as primary storage. Typically, non-volatile memory either costs more or has a poorer performance than volatile random access memory.

Several companies are working on developing non-volatile memory systems comparable in speed and capacity to volatile RAM. MRAMS and DRAMs (magneto-resistive random access memory and dynamic random access memory) are among the devices currently being developed and offered, together with FRAMs (ferroelectic random access memory). The devices of the inventions disclosed herein, fundamentally transistors or more specifically field effect transistors (FETs) provide persistent memory due to the strong polarization and vertical anisotropy of chromia underlying the conductive channel. Such devices exhibit high remanence and provide FET with multistage logic capability with voltage control of both spin and current. The invention provides a nonvolatile transistor where read and write operations can be separated. Thus, the devices of the disclosed invention are capable of and combine memory and logic operations. Fundamentally, regardless of how they are ultimately deployed, the spin-FET and similar devices of the invention offer a memory device where no refresh current or reserve memory is required to retain and access the last state written.

BIBLIOGRAPHY

[Andreev 96] A. F. Andreev. *JETP Lett.* 63, 758 (1996)
[Belaschenko 10] K. D. Belashchenko, *Phys. Rev. Lett.* 105, 147204 (2010)
[Bibes 08] M. Bibes, A. Barthélémy, *Nature Materials* 2008 7, 425-426
[Binek 05] Ch. Binek, B. Doudin, *J. Phys. Condens. Matter* 17, L39-L44 (2005)
[Borisov 05] P. Borisov, A. Hochstrat, X. Chen, W. Kleemann, Ch. Binek, *Phys. Rev. Lett.* 94, 117203 (2005).
[Brosse 04] J. de Brosse, *Nanotechnology Symposium*, Cornell's CNS, slides available online at: http://www.cns.cornell.edu/documents/JohnDeBrosseCNSSymp504.pdf, May 14, 2004.
[Chu 08] Y.-H. Chu, et al., *Nat. Mater.* 7, 478-482 (2008).
[Datta 90] S. Datta and B. Das, *Applied Physics Lett.* 56, 665 (1990)
[Dery 07] H. Dery, P. Dalal, L. Cywiński, L. J. Sham, *Nature* 447, 573 (2007)
[Dowben 91] P. A. Dowben, D. LaGraffe, D. Li, A. Miller, Ling Zhang, L. Dottl, and M. Onellion, *Physical Review B* 43 (1991) 3171-3179.
[Dowben 11] P. A. Dowben, N. Wu, and Ch. Binek, *Journ. Phys. Cond. Matter* 23 (2011) 171001
[Durlam 03] M. Durlam, D. Addie, J. Akerman, B. Butcher, P. Brown, J. Chan, M. DeHerrera, B. N. Engel, B. Feil, G. Grynkewich, J. Janesky, M. Johnson, K. Kyler, J. Molla, J. Martin, K. Nagel, J. Ren, N. D. Rizzo, T. Rodriguez, L. Savtchenko, J. Slater, J. M. Slaughter, K. Smith, J. J. Sun, M. Lien, K. Papworth, P. Shah, W. Qin, R. Williams, L. Wise, and S. Tehrani, *IEDM Technical Digest*, p. 34.6.1 (IEEE Press, New York, 2003)
[Fallarino 14] L. Fallarino, A. Berger, and Ch. Binek, *Appl. Phys. Lett.* 2014 104 022403.
[Feibig 05] M. Fiebig, "Revival of the Magnetoelectric effect", *J. Phys. D: Appl. Phys.* 38 (2005) R123-R152
[He 10] X. He, Y. Wang, N. Wu, A. N. Caruso, E. Vescovo, K. D. Belashchenko, P. A. Dowben, Ch. Binek, *Nature Materials* 9, 579 (2010)
[Johnson 00] M. Johnson, B. R. Bennett, P. R. Hammar, and M. M. Miller, *Sol. St. Electron.* 44, 1099 (2000)
[Jonker 07] B. T. Jonker, G. Kioseoglou, A. T. Hanbicki, C. H. Li, and P. E. Thompson, *Nature Phys.* 3, 542 (2007)
[Kleeman 13] W. Kleemann, *J. Appl. Phys.* 2013 114 027013.
[Miller 93] A. Miller and P. A. Dowben, *J. Phys. Condensed Matter* 5 (1993) 5459-5470.
[Ney 03] A. Ney, C. Pampuch, R. Koch, K. H. Ploog, *Nature* 425, 485-487 (2003)
[Semenov 07] Y. G. Semenov, K. W. Kim, J. M. Zavada, Appl. Phys. Lett. 91 (2007) 153105
[Semenov 10] Y. G. Semenov, J. M. Zavada, and K. W. Kim, *J. Appl. Phys.* 107 (2010) 064507
[Schmidt 00] G. Schmidt et al. Phys. Rev. B 62, R46267 (2000)

[van Dijken 02] S. van Dijken et al. Appl. Phys. Lett. 80, 3364 (2002)

[van't Erve 07] J. O. M. J. van't Erve, A. T. Hanbicki, M. Holub, C. H. Li, C. Awo-Affouda, P. E. Thompson, B. T. Jonker, *Appl. Phys. Lett.* 91, 212109 (2007)

[Wang 14] J. Wang, J. A. Colon Santana, N. Wu, C. Karunakaran, J. Wang, P. A. Dowben, and Ch. Binek, *J. Physics Condensed Matter* 26 (2014) 055012.

[Wu 11] N. Wu, Xi He, A. Wysocki, U. Lanke, T. Komesu, K. D. Belashchenko, Ch. Binek, P. A. Dowben, *Physical Review Letters* 106, 087202 (2011)

[Zaliznyak] I. Zaliznyak, A. Tsvelik, D. Kharzeev, U.S. Patent Application US 2010/0109712 A1, May 6, 2010

[Zhao 06] T. Zhao, et al., *Nat. Mater.* 5, 823-829 (2006).

[Zhirnov 05] V. V. Zhirnov, J. A. Hutchby, G. I. Bourianoffls, J. E. Brewer, *IEEE—Circuits and Devices* 21, 37 (2005)

This invention has been disclosed in terms of both a general description, as well as by specific example. The examples are intended to illustrate the principles and foundations of the invention, and should not be considered limiting in the absence of specific restrictions excluding those examples in the claims set forth below.

What is claimed as new and inventive is:

1. A magneto-electric spin field effect transistor (spin-FET) comprising:
    a layer of a magneto-electric gate dielectric,
    a thin film of a conductive channel material selected from the group consisting of graphene, InP, GaSb, PbS, $MoS_2$, $WS_2$, $MoSe_2$, $WSe_2$ and mixtures thereof;
    wherein said magneto-electric gate film and said channel material are in intimate contact along an interface there between,
    a source and drain disposed in electrical contact with said thin film of channel material.

2. The spin-FET of claim 1, wherein said film of a magneto-electric dielectric is comprised of chromia, $Fe_2TeO_6$ or $LuFeO_3$.

3. The spin-FET of claim 2, wherein said layer of magneto-electric dielectric is comprised of chromia.

4. The spin-FET of claim 1, where no refresh current is required to retain the last state written.

5. The spin-FET of claim 4 which is a transistor which is susceptible to separated read and write operations.

6. The spin-FET of claim 4 that combines memory and logic operations.

7. The spin-FET of claim 1 with multistate logic.

8. The spin-FET of claim 7, wherein both spin and current of said spin-FET is voltage controlled.

* * * * *